US012598716B2

(12) United States Patent
Wan et al.

(10) Patent No.: US 12,598,716 B2
(45) Date of Patent: Apr. 7, 2026

(54) SENSOR DEVICE AND VALVE ASSEMBLY WITH IMPROVED SEALING FEATURES

(71) Applicant: Hangzhou Sanhua Research Institute Co., LTD., Hangzhou City (CN)

(72) Inventors: Xia Wan, Hangzhou City (CN); Qihong Jin, Hangzhou City (CN); Longzhong Huang, Hangzhou City (CN); Linjie Huang, Coconut Creek, FL (US)

(73) Assignee: HANGZHOU SANHUA RESEARCH INSTITUTE CO., LTD., Hangzhou City (CN)

( * ) Notice: Subject to any disclaimer, the term of this patent is extended or adjusted under 35 U.S.C. 154(b) by 290 days.

(21) Appl. No.: 18/217,509

(22) Filed: Jun. 30, 2023

(65) Prior Publication Data

US 2023/0345657 A1     Oct. 26, 2023

Related U.S. Application Data

(63) Continuation-in-part of application No. PCT/CN2021/135068, filed on Dec. 2, 2021.

(30) Foreign Application Priority Data

Dec. 31, 2020     (CN) .......................... 202011642169.9

(51) Int. Cl.
*H05K 5/06*        (2006.01)
*H05K 5/02*        (2006.01)

(52) U.S. Cl.
CPC ........... *H05K 5/069* (2013.01); *H05K 5/0209* (2022.08); *H05K 5/066* (2013.01)

(58) Field of Classification Search
CPC . G01L 19/147; G01L 9/0072; G01L 19/0645; G01L 19/0084; G01L 13/025; G01L 19/007; G01L 9/0042; G01L 19/0038; G01L 9/0073; G01L 9/0075; G01L 9/0054; G01L 9/0055; G01L 19/04; G01L 7/00; G01L 7/04; G01L 19/148; G01L 19/14; G01L 19/143; G01L 17/00;

(Continued)

(56) References Cited

FOREIGN PATENT DOCUMENTS

| CN | 1453566 A | 11/2003 |
| CN | 203078240 U | 7/2013 |

(Continued)

*Primary Examiner* — Andre J Allen
(74) *Attorney, Agent, or Firm* — Cheng-Ju Chiang

(57)     ABSTRACT

A sensor device includes a housing, a circuit substrate, a sensing element, and a sleeve. The sensor device further includes an inner cavity and a channel located on different sides of the circuit substrate, respectively. The sleeve has a cylinder wall located on a periphery of the channel. A tail end of the cylinder wall in an axial direction of the channel is sealably connected to the circuit substrate. The housing is provided with a matching part including an accommodation part and a first peripheral wall part forming the accommodation part. The sleeve is at least partially accommodated in the accommodation part. The first peripheral wall part is sealably connected to the cylinder wall. The inner cavity is not communicated with the channel. The sealing performance between the inner cavity of the sensor device and the channel is good. Also provided is a valve assembly having the sensor device.

20 Claims, 11 Drawing Sheets

100

(58) Field of Classification Search
CPC ....... G01L 7/18; G01L 19/0092; G01L 15/00;
G01L 9/0051; G01L 7/041; G01L 9/12;
G01L 9/065; G01L 19/0618; G01L
9/0052; G01L 9/125; G01L 7/16; G01L
19/0609; G01L 19/003; G01L 9/007;
G01L 19/0627; G01L 19/0046; G01L
9/0022; G01L 9/06; G01L 19/0636; G01L
7/084; G01L 13/02; G01L 19/0023; G01L
19/142; G01L 7/043; G01L 19/08; G01L
9/0002; G01L 19/02; G01L 9/008; G01L
19/141; G01L 9/006; G01L 11/02; G01L
19/0672; G01L 23/10; G01L 23/18; G01L
19/0681; G01L 9/0077; G01L 19/12;
G01L 27/005; G01L 7/082; G01L 9/0044;
G01L 19/0015; G01L 19/0069; G01L
7/063; G01L 9/0001; G01L 19/146; G01L
21/12; G01L 27/002; G01L 27/007; G01L
9/16; G01L 11/00; G01L 19/00; G01L
9/0026; G01L 9/0089; G01L 9/045; G01L
9/14; G01L 19/0654; G01L 1/2281; G01L
11/025; G01L 13/026; G01L 11/008;
G01L 7/22; G01L 13/00; G01L 9/0047;
G01L 7/08; G01L 9/0076; G01L 9/0025;
G01L 9/0035; G01L 19/0061; G01L
9/0005; G01L 9/0041; G01L 9/0019;
G01L 9/08; G01L 9/10; G01L 21/00;
G01L 9/04; G01L 11/006; G01L 19/086;
G01L 9/00; G01L 9/0008; G01L 1/18;
G01L 11/004; G01L 19/069; G01L
9/0057; G01L 19/083; G01L 19/06; G01L
19/10; G01L 19/16; G01L 9/0016; G01L
13/023; G01L 7/048; G01L 9/0048; G01L
9/0027; G01L 9/0086; G01L 9/0079;
G01L 11/04; G01L 1/20; G01L 9/0091;
G01L 27/00; G01L 11/002; G01L 23/24;
G01L 7/182; G01L 1/02; G01L 19/0663;
G01L 7/166; G01L 23/22; G01L 9/0036;
G01L 9/0061; G01L 9/0039; G01L
23/125; G01L 19/145; G01L 9/0013;
G01L 21/04; G01L 9/0045; G01L 9/0092;
G01L 1/142; G01L 7/104; G01L 9/0033;
G01L 9/0083; G01L 9/0098; G01L
1/2293; G01L 7/24; G01L 9/02; G01L
21/22; G01L 9/0029; G01L 7/022; G01L
1/205; G01L 9/0064; G01L 23/08; G01L
5/14; G01L 13/06; G01L 23/16; G01L
7/088; G01L 7/163; G01L 9/0007; G01L
23/222; G01L 1/16; G01L 1/2287; G01L
9/0085; G01L 9/025; G01L 1/2212; G01L
21/14; G01L 9/0004; G01L 23/02; G01L
9/003; G01L 9/085; G01L 1/14; G01L
1/148; G01L 9/0058; G01L 9/105; G01L
7/02; G01L 7/061; G01L 9/002; G01L
1/2231; G01L 13/028; G01L 9/0095;
G01L 23/28; G01L 1/162; G01L 19/0076;
G01L 7/12; G01L 9/0038; G01L 9/0032;
G01L 21/10; G01L 7/024; G01L 19/149;
G01L 1/246; G01L 7/086; G01L 1/005;
G01L 5/228; G01L 7/06; G01L 1/2206;
G01L 7/102; G01L 13/021; G01L 27/02;
G01L 1/2262; G01L 1/24; G01L 1/26;
G01L 23/00; G01L 9/0094; G01L 19/144;
G01L 9/0082; G01L 1/125; G01L 9/0097;
G01L 1/2268; G01L 11/06; G01L 21/30;
G01L 21/34; G01L 23/221; G01L 7/187;
G01L 7/20; G01L 1/146; G01L 23/26;
G01L 7/068; G01L 1/144; G01L 1/225;
G01L 23/32; G01L 7/14; G01L 1/165;
G01L 23/12; G01L 1/241; G01L 13/04;
G01L 7/045; G01L 1/086; G01L 1/22;
G01L 7/108; G01L 9/18; G01L 1/127;
G01L 17/005; G01L 5/18; G01L 1/245;
G01L 21/32; G01L 1/183; G01L 1/2218;
G01L 9/0023; G01L 1/243; G01L 23/145;
G01L 5/0047; G01L 5/0076; G01L
9/0088; G01L 1/106; G01L 1/10; G01L
9/001; G01L 1/186; G01L 23/223; G01L
25/00; G01L 5/165; G01L 5/226; G01L
9/0017; G01L 1/044; G01L 3/245; G01L
9/005; G01L 1/08; G01L 21/16; G01L
3/1485; G01L 5/0038; G01L 5/162; G01L
5/225; G01L 7/026; G01L 7/065; G01L
9/0014; G01L 1/04; G01L 1/242; G01L
21/24; G01L 3/10; G01L 5/004; G01L
5/0052; G01L 5/24; G01L 7/10; G01L
1/00; G01L 1/103; G01L 1/2275; G01L
1/247; G01L 21/02; G01L 21/26; G01L
23/225; G01L 3/102; G01L 3/105; G01L
5/223; G01L 7/028; G01L 9/0011; G01L
5/00; G01L 5/0028; G01L 5/243; G01L
1/083; G01L 1/12; G01L 21/36; G01L
23/04; G01L 23/14; G01L 23/30; G01L
3/103; G01L 5/0033; G01L 5/102; G01L
5/133; G01L 5/1627; G01L 5/166; G01L
7/185; G01L 1/255; G01L 21/08; G01L
5/0057; G01L 5/22; G01L 1/042; G01L
1/122; G01L 1/2225; G01L 1/2243; G01L
1/2256; G01L 1/248; G01L 2009/0067;
G01L 2009/0069; G01L 21/06; G01L
23/06; G01L 3/00; G01L 3/06; G01L
3/1478; G01L 3/1492; G01L 3/18; G01L
3/24; G01L 3/242; G01L 5/0061; G01L
5/08; G01L 5/10; G01L 5/101; G01L
5/108; G01L 5/16; G01L 5/161; G01L
5/167; G01L 5/28; G01L 1/046; G01L
2009/0066; G01L 2019/0053; G01L
23/085; G01L 23/20; G01L 5/0071; G01L
5/008; G01L 5/06; G01L 5/171; G01L
7/106; H05K 2201/10151; H05K 7/14;
H05K 1/118; H05K 1/185; H05K
2201/09781; H05K 3/202; H05K 7/1462;
H05K 1/0306; H05K 1/167; H05K 3/306;
H05K 1/02; H05K 1/028; H05K 1/0296;
H05K 1/0373; H05K 1/147; H05K 1/181;
H05K 2201/0133; H05K 2201/0236;
H05K 2201/03; H05K 2201/0397; H05K
2201/09063; H05K 2201/0949; H05K
2201/09736; H05K 2201/10446; H05K
2203/049; H05K 2203/107; H05K 3/105;
H05K 3/185; H05K 3/301; H05K 3/308;
H05K 3/326; H05K 5/0078; H05K
5/0091; H05K 5/0213; H05K 5/0215;
H05K 5/068; H05K 7/20836; H05K
1/0218; H05K 1/0228; H05K 1/0231;
H05K 1/0251; H05K 1/0257; H05K
1/0259; H05K 1/0268; H05K 1/0272;
H05K 1/0293; H05K 1/0298; H05K
1/0393; H05K 1/095; H05K 1/111; H05K
1/113; H05K 1/144; H05K 1/18; H05K 13/00; H05K 13/04; H05K 13/0413; H05K 2201/0116; H05K 2201/042; H05K 2201/0738; H05K 2201/09036; H05K 2201/09072; H05K 2201/09763; H05K 2201/10189; H05K 2201/10196; H05K 2201/10303; H05K 2201/10325; H05K 2201/1059; H05K 2201/2036; H05K 2203/0165; H05K 2203/0191; H05K 2203/085; H05K 2203/1147; H05K 2203/1178; H05K 2203/1453; H05K 2203/1469; H05K 2203/173; H05K 2203/304; H05K 3/1216; H05K 3/225; H05K 3/26; H05K 3/28; H05K 3/30; H05K 3/34; H05K 3/341; H05K 3/3421; H05K 3/3447; H05K 3/4602; H05K 5/0082; H05K 5/0204; H05K 5/0216; H05K 7/02; H05K 7/14337; H05K 7/20; H05K 1/14; H05K 1/141; H05K 13/0815; H05K 13/082; H05K 2201/09909; H05K 2203/0285; H05K 2203/0568; H05K 3/282; H05K 3/303; H05K 3/3452; H05K 5/0017; H05K 5/003; H05K 5/06; G01K 13/02; G01K 1/14; G01K 1/024; G01K 1/20; G01K 7/32; G01K 5/36; G01K 7/16; G01K 1/08; G01K 2205/02; G01K 7/18; G01K 1/022; G01K 7/01; G01K 7/015; G01K 7/186; G01K 7/34; G01K 11/3206; G01K 11/3213; G01K 7/021; G01K 1/045; G01K 1/24; G01K 5/32; G01K 5/40; G01K 5/72; G01K 7/20; G01K 7/22; G01K 7/24; G01K 11/32; G01K 5/48; G01K 1/02; G01K 13/028; G01K 5/16; G01K 5/28; G01K 5/52; G01K 5/64; G01K 5/70; G01K 7/00; G01K 1/00; G01K 1/18; G01K 2205/00; G01K 5/46; G01K 5/62; G01K 7/028; G01K 1/12; G01K 1/26; G01K 11/12; G01K 11/26; G01K 15/00; G01K 2211/00; G01K 5/30; G01K 5/326; G01K 7/38; G01K 1/028; G01K 1/143; G01K 11/20; G01K 13/00; G01K 2215/00; G01K 3/14; G01K 7/023; G01K 1/026; G01K 11/00; G01K 11/22; G01K 11/24; G01K 13/10; G01K 2219/00; G01K 3/00; G01K 3/04; G01K 5/42; G01K 7/026; G01K 7/343; G01K 1/16; G01K 11/265; G01K 13/026; G01K 2201/00; G01K 5/58; G01K 7/02; G01K 1/04; G01K 1/146; G01K 11/02; G01K 11/14; G01K 13/024; G01K 13/25; G01K 15/005; G01K 17/00; G01K 17/08; G01K 17/14; G01K 17/20; G01K 3/005; G01K 3/06; G01K 3/12; G01K 5/00; G01K 5/025; G01K 5/323; G01K 5/38; G01K 5/465; G01K 5/483; G01K 5/50; G01K 7/06; G01K 7/183; G01K 7/206; G01K 7/226; G01K 1/06; G01K 1/10; G01K 11/324; G01K 13/20; G01K 2201/02; G01K 7/223

USPC ..................................................... 73/700–756

See application file for complete search history.

(56)                References Cited

FOREIGN PATENT DOCUMENTS

| CN | 103728093 | A |   | 4/2014 | |
|----|-----------|---|---|--------|---|
| CN | 107817015 | A |   | 3/2018 | |
| CN | 104854437 | B | * | 7/2018 | ............. G01L 19/14 |
| CN | 110735958 | A |   | 1/2020 | |
| CN | 111503277 | A |   | 8/2020 | |
| CN | 113108115 | A | * | 7/2021 | ......... F16K 37/0025 |
| CN | 113108832 | A | * | 7/2021 | ............. G01K 13/02 |
| CN | 214066405 | U |   | 8/2021 | |
| CN | 214308873 | U | * | 9/2021 | |
| CN | 114838862 | A | * | 8/2022 | ............... G01L 9/02 |
| CN | 115144124 | A | * | 10/2022 | ......... G01L 19/0092 |
| JP | H10-111198 | A |   | 4/1998 | |
| WO | 2022/142994 | A1 |   | 7/2022 | |

* cited by examiner

100

100

300

SENSOR DEVICE AND VALVE ASSEMBLY WITH IMPROVED SEALING FEATURES

CROSS-REFERENCE TO RELATED APPLICATION

The present disclosure is a bypass continuation-in-part of National Phase conversion of International (PCT) Patent Application No. PCT/CN2021/135068, filed on Dec. 2, 2021, which further claims priority of a Chinese Patent Application No. 202011642169.9, filed on Dec. 31, 2020 and titled "SENSOR DEVICE AND VALVE ASSEMBLY", the entire content of which is incorporated herein by reference.

TECHNICAL FIELD

The present disclosure relates to a technical field of signal sensing and in particular, to a sensor device and a valve assembly.

BACKGROUND

Sensors in the related art generally include a bottom shell, a top shell and a ceramic base. The ceramic base is provided with a through hole. A surface of the ceramic base is bonded with a back pressure chip through adhesive. A flow channel is used to guide a fluid to the through hole, and then to a back pressure cavity of the back pressure chip. The bottom shell has a groove in which a sealing ring is located. The ceramic base is sealed by a sealing ring in order to prevent the fluid from a lower portion from leaking into an inner cavity of an upper portion of the ceramic base.

SUMMARY

The present disclosure provides a sensor device including a shell and a sensing assembly, the sensing assembly including a circuit substrate, a sensing element and a sleeve, the sensor device further including an inner cavity and a channel, the inner cavity and the channel being located on different sides in a thickness direction of the circuit substrate, respectively;

wherein the sleeve is located on one side in the thickness direction of the circuit substrate, the sleeve has a cylinder wall, one end of the cylinder wall along an axial direction of the channel is hermetically connected to the circuit substrate, the cylinder wall of the sleeve is located at an outer periphery of the channel, the sensing element is electrically connected to the circuit substrate, the sensing element is capable of sensing pressure and/or temperature of a fluid in the channel; and the shell has a fitting portion, the fitting portion and the sleeve are located on a same side in the thickness direction of the circuit substrate, the fitting portion has an accommodating portion, the sleeve is at least partially accommodated in the accommodating portion, the fitting portion includes a first peripheral wall portion forming the accommodating portion, the first peripheral wall portion is in sealing connection with an outer peripheral side of the cylinder wall of the sleeve, and the inner cavity is not in communication with the channel.

The present disclosure also provides a valve assembly including a valve body portion, the valve body portion being provided with a first flow channel, wherein the valve assembly further includes a sensor device mounted to the valve body portion, the sensor device is the aforementioned sensor device, and the channel is in fluid communication with the first flow channel.

In some embodiments of the sensor device provided by the present disclosure, the sleeve is at least partially accommodated in the accommodating portion, the end of the cylinder wall of the sleeve in the axial direction of the channel is hermetically connected with the circuit substrate, and the outer peripheral side of the cylinder wall is in sealing connection with the first peripheral wall portion of the fitting portion, so that the tightness between the inner cavity and the channel is better.

DETAILED DESCRIPTION

Figure 1:
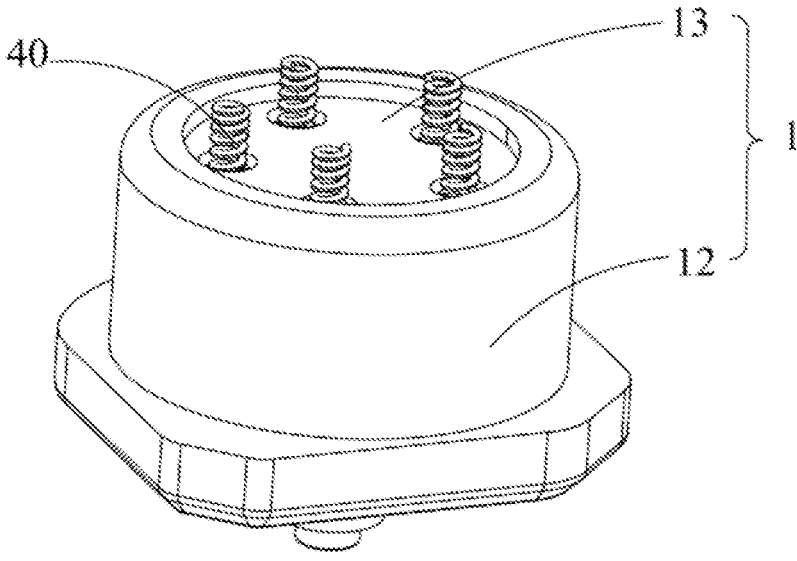
FIG. 1 is a schematic perspective structural view of a sensor device in a first embodiment of the present disclosure.
Figure 2:
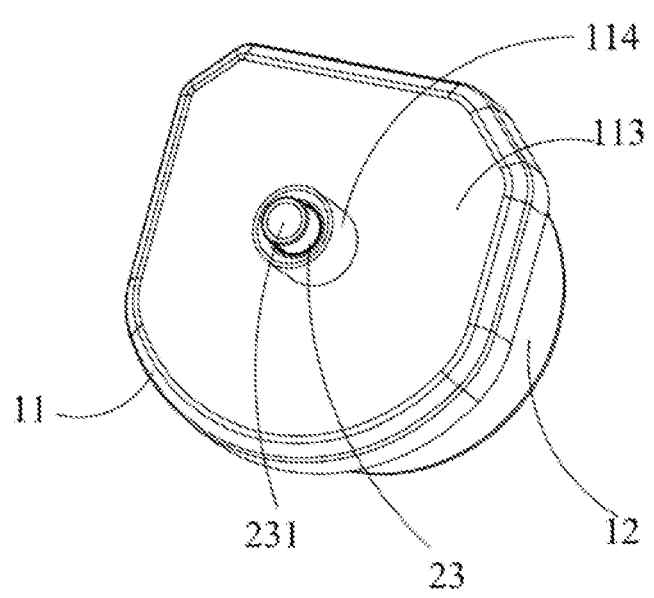
FIG. 2 is a schematic perspective structural view of the sensor device shown in FIG. 1 from another angle.

Embodiments of the present disclosure are described in detail below, and examples of the embodiments are shown in drawings. The embodiments described below with reference to the drawings are exemplary, and are intended to explain the present disclosure, but should not be understood as a limitation to the present disclosure. The exemplary embodiments will be described in detail here, and examples thereof are shown in the drawings. When the following description refers to the drawings, unless otherwise indicated, the same numbers in different drawings indicate the same or similar elements. The implementation embodiments described in the following exemplary embodiments do not represent all implementation embodiments consistent with the present disclosure. On the contrary, they are merely examples of devices and methods consistent with some aspects of the present disclosure as detailed in the appended claims.

The terms used in the present disclosure are only for the purpose of describing specific embodiments, and are not intended to limit the protection scope of the present disclosure. As used in the specification and claims of the present disclosure, the singular forms "a," "the," or "said" are intended to include the plural forms as well, unless the context clearly dictates otherwise.

It should be understood that words such as "first", "second" and similar words used in the specification and claims of the present disclosure do not indicate any order, quantity or importance, but are only used to distinguish the naming of features. Likewise, "a" or "an" and the like do not denote a quantitative limitation, but rather denote the presence of at least one. Unless otherwise specified, words such as "front", "rear", "left", "right", "top", "bottom" and other similar words appearing in present disclosure are only for the convenience of description, and are not limited to a specific position or a spatial orientation. Words such as "including", "comprising" and the like are an open-ended formulation, meaning that elements appearing before "including" or "comprising" encompass elements appearing after "including" or "comprising" and their equivalents. This does not exclude that elements appearing before "including" or "comprising" can also include other elements. In present disclosure, if "a plurality of" appears, it means two or more.

As shown in FIG. 1 to FIG. 15, the present disclosure provides a sensor device 100. The sensor device 100 includes a shell 1 and a sensing assembly 2. At least part of the sensing assembly 2 is accommodated in the shell 1. The sensor device 100 is further provided with an inner cavity 200 and a channel 231.

The sensing assembly 2 includes a circuit substrate 21, at least one sensing element 22 and a sleeve 23. The inner cavity 200 and the channel 231 are located on different sides of the circuit substrate 21 in a thickness direction, respectively. The circuit substrate 21 includes a first surface 211, a second surface 212 and a side surface 215. The first surface 211 and the second surface 212 are located on different sides of the circuit substrate 21 in the thickness direction, respectively. The side surface 215 is located between the first surface 211 and the second surface 212. The first surface 211 may be an upper side surface of the circuit substrate 21 shown in FIG. 7. The second surface 212 may be a lower side surface of the circuit substrate 21 shown in FIG. 7. The inner cavity 200 is located on a side where the first surface 211 of the circuit substrate 21 is located. The channel 231 is located on another side where the second surface 212 of the circuit substrate 21 is located. A plurality of circuit elements 213 may be disposed on the first surface 211, that is, the plurality of circuit elements 213 are mostly distributed in the inner cavity 200. The circuit elements 213 may be common circuit elements such as resistors, capacitors, inductors, conditioning chips, and processing chips. The first surface 211 of the circuit substrate 21 may also be provided with a plurality of pads 214 for soldering the circuit elements 213 and for transmitting electrical signals to the outside. In the related art, such as in the application scenario of automotive air conditioning system, the sensor device 100 can be used to detect the temperature and/or pressure of a refrigerant in the automotive air conditioning system. Due to the high pressure of automotive air conditioners, the pressure of the refrigerant generally reaches 500 Psi. Therefore, it is more important to ensure the tightness of an internal space of the sensor assembly under high pressure, and special attention should be paid to avoid that the circuit components contacting with fluids (such as the refrigerant) as much as possible. Correspondingly, in order to ensure the normal operation of the circuit element 213, the inner cavity 200 is not communicated with the channel 231 which is configured for fluid flow. This is beneficial for the entire sensor device 100 to ensure better sealing performance.

The sleeve 23 is located on one side in a thickness direction of the circuit substrate 21. The sleeve 23 has a cylinder wall 232. The cylinder wall 232 is located at a periphery of the channel 231. In some embodiments, the sleeve 23 is of a hollow cylindrical structure, and a hollow area of the sleeve 23 forms the channel 231. Of course, in other embodiments, the channel 231 may also be formed by other elements located in the sleeve 23.

The cylinder wall 232 of the sleeve 23 has two ends along an axial direction of the channel 231, namely a first end 233, a second end 234 and a middle section 235 between the first end 233 and the second end 234. The first end 233 is an upper end of the cylinder wall 232 in FIG. 10. The second end 234 is a lower end of the cylinder wall 232 in FIG. 10. The first end 233 is hermetically connected to the circuit substrate 21. In this way, when the fluid flows in the channel 231, the fluid is not easy to leak out from a position where the first end 233 of the cylinder wall 232 is sealed with the circuit substrate 21, that is, it is not easy to leak from the channel 231 to the inner cavity 200.

The sensing element 22 is electrically connected to the circuit substrate 21. The sensing element 22 is capable of sensing pressure and/or temperature of the fluid within the channel 231. That is, the sensing element 22 can simultaneously integrate the functions of temperature sensing and pressure sensing. The sensing assembly 2 can only have one sensing element 22 to realize the sensing of the temperature signal and the pressure signal. Of course, the sensing element 22 can also be used only for sensing temperature, or only for sensing pressure. When the sensor device 100 needs temperature and pressure sensing, the sensing assembly 2 can be provided with two or more sensing elements 22, so that temperature sensing is achieved through one sensing element 22, and pressure sensing is achieved through the other sensing element 22.

The shell 1 has a fitting portion 11. The fitting portion 11 and the sleeve 23 are located on a same side in the thickness direction of the circuit substrate 21, that is, the fitting portion 11 and the sleeve 23 are both located on a side where second surface 212 of the circuit substrate 21 is located. The fitting portion 11 has an accommodating portion 111. The accommodating portion 111 may be a through hole structure extending through the fitting portion 11, so as to facilitate processing and manufacturing.

The sleeve 23 is at least partially accommodated in the accommodating portion 111. The fitting portion 11 includes a first peripheral wall portion 112 which forms the accommodating portion 111. The first peripheral wall portion 112 is hermetically connected to the outer peripheral side of the cylinder wall 232 of the sleeve 23. In this way, the fluid is not easy to enter between the cylinder wall 232 of the sleeve 23 and the first peripheral wall portion 112 of the fitting portion 11, and correspondingly, it is not easy to flow into the inner cavity 200 above the circuit substrate 21.

Figure 5:
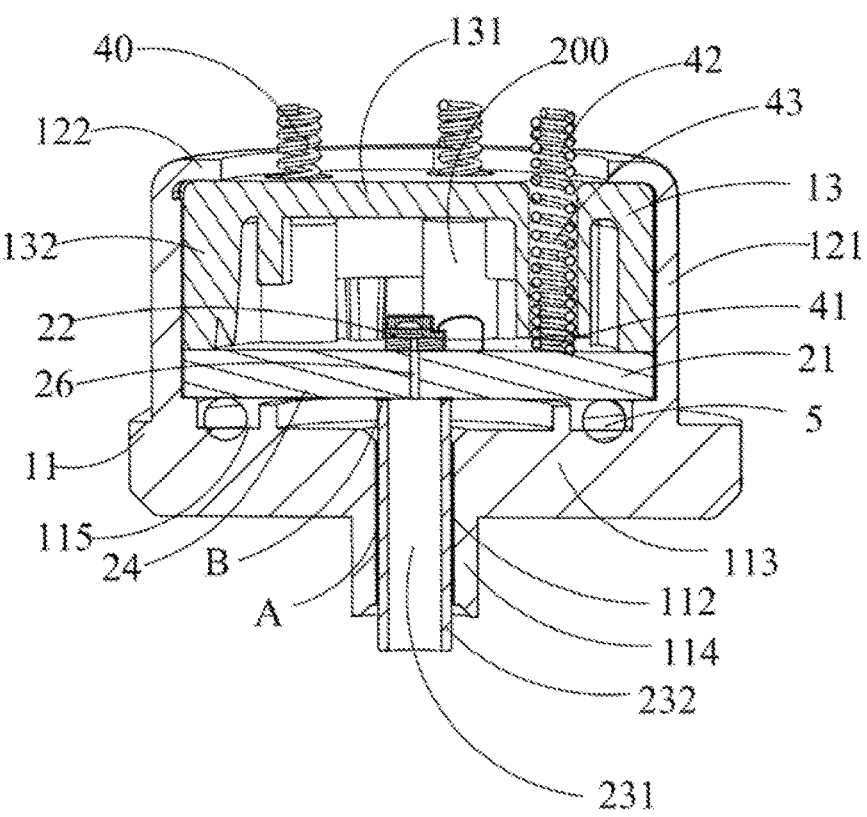
FIG. 5 is a schematic cross-sectional view of the sensor device shown in FIG. 1.
Figure 6:
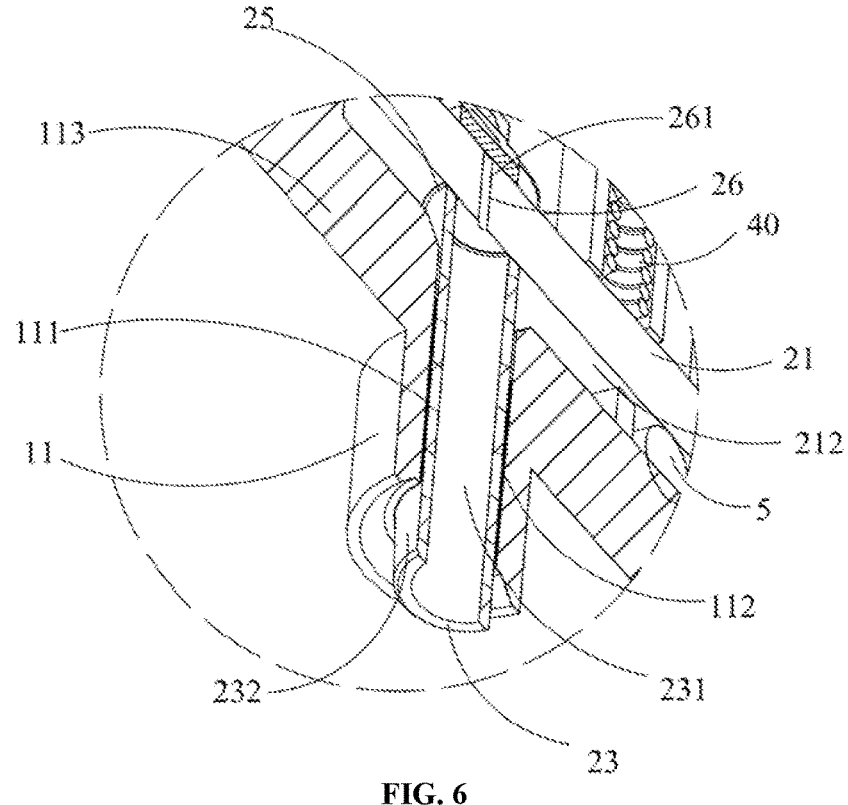
FIG. 6 is a schematic perspective cross-sectional view of the sensor device shown in FIG. 1 from another angle.
Figure 7:
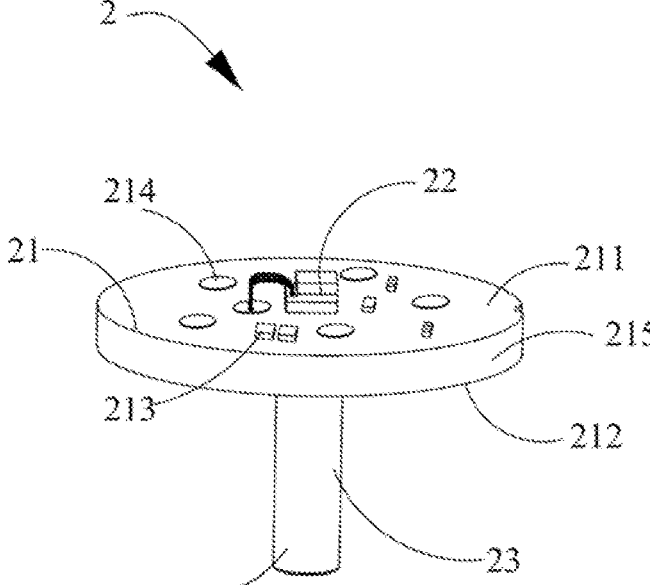
FIG. 7 is a schematic perspective structural view corresponding to an embodiment of a sensing assembly as shown in FIG. 1.

Referring to FIG. 5, there is a first sealing position A between an outer side of the cylinder wall 232 of the sleeve 23 and the first peripheral wall portion 112 of the fitting portion 11. There is a second sealing position B between the first end 233 of the cylinder wall 232 and the second surface 212 of the circuit substrate 21. Through the sealing of the above two key positions, the inner cavity 200 of the sensor device 100 and the channel 231 of the sleeve 23 can be discommunicated, so that the sealing between the inner cavity 200 and the channel 231 is better. Compared with the related art which uses sealing rings to achieve sealing, the embodiments of the present disclosure use welding or bonding connection relationship between different structural components to achieve sealing. As a result, the present disclosure is less prone to the problem of fatigue failure of the sealing rings, and the sealing reliability is higher.

In some embodiments, the first end 233 of the cylinder wall 232 along the axial direction of the channel 231 and the circuit substrate 21 can be sealed and fixed as an integral structure by one of soldering, laser welding, and bonding. The first peripheral wall portion 112 and an outer peripheral side of the cylinder wall 232 are sealed and fixed into an integral structure by one of soldering, laser welding, bonding, and ultrasonic welding. In actual processing, the cylinder wall 231 and the circuit substrate 21 may be sealed and fixed first. Then, the assembly formed by the two is put into the shell 1, and then the sealing between the first peripheral wall portion 112 and the outer peripheral side of the cylinder wall 232 is realized. As a result, the installation operation is simpler, and the processing and manufacturing are convenient.

In some embodiments, the circuit substrate 21 includes a ceramic base 24 and a metal bonding portion 25 covered on a part of a surface area of the ceramic base 24 by a copper cladding process. The metal bonding portion 25 is located at least partially on a lower side surface of the ceramic base 24. Of course, the base of the circuit substrate 21 can also be a common resin-based circuit board material. However, the ceramic base 24 is more resistant to high temperature and corrosion than ordinary resin circuit boards, so it is more favorable to the fluid environment of high temperature and high pressure. The copper cladding process is a process in which the idle space on the circuit substrate is used as a reference plane and then filled with solid copper. The copper cladding process is a relatively mature technology in the field of circuit board manufacturing, and will not be described in detail in present disclosure. The metal bonding portion may form a metal pad 214 for connecting the circuit elements 213 and transmitting signals to the outside, and other circuit board structures having functions such as electrical conduction and heat conduction.

A material of the sleeve 23 is metal. The cylinder wall 232 of the sleeve 23 and the metal bonding portion 25 are sealed and connected by soldering. The soldering process has lower cost and better sealing effect, and is suitable for industrial production. A material of the fitting portion 11 of the shell 1 is also metal. Correspondingly, the first peripheral wall portion 112 of the fitting portion 11 and the outer peripheral side of the cylinder wall 232 are sealed and fixed by means of laser welding. The sealing effect of laser welding is better, and laser welding is more suitable for the welding of micro parts and parts with poor accessibility. And laser welding also has the characteristics of low heat input and small welding deformation. When manufacturing the sensor device 100, all components can be assembled first. Laser welding can be used as the last processing step. That is, the sealing between the fitting portion 11 and the cylinder wall 232 is achieved by laser welding at the first sealing position A in FIG. 5, the soldering temperature is not easy to damage other components, and the soldering process has less influence on the assembly deformation of other components.

In some embodiments, as shown in FIG. 5, the shell 1 includes a first shell 12 and a second shell 13. The first shell 12 includes an outer cylindrical portion 121, the fitting portion 11 and a bent portion 122. One side of the outer cylindrical portion 121 in an axial direction (i.e., a vertical direction in FIG. 5) is connected to the fitting portion 11, and the other side is connected to the bent portion 122. The outer cylindrical portion 121 is provided around the circuit substrate 21. The bent portion 122 extends from the outer cylindrical portion 121 toward the axial direction of the outer cylindrical portion 121.

The second shell 13 has a main body portion 131 and an extension portion 132. The inner cavity 200 is located between the main body portion 131 and the circuit substrate 21. The extension portion 132 is located on an outer periphery of the main body portion 131. The extension portion 132 presses against the circuit substrate 21. The bent portion 122 presses against the extension portion 132.

Figure 3:
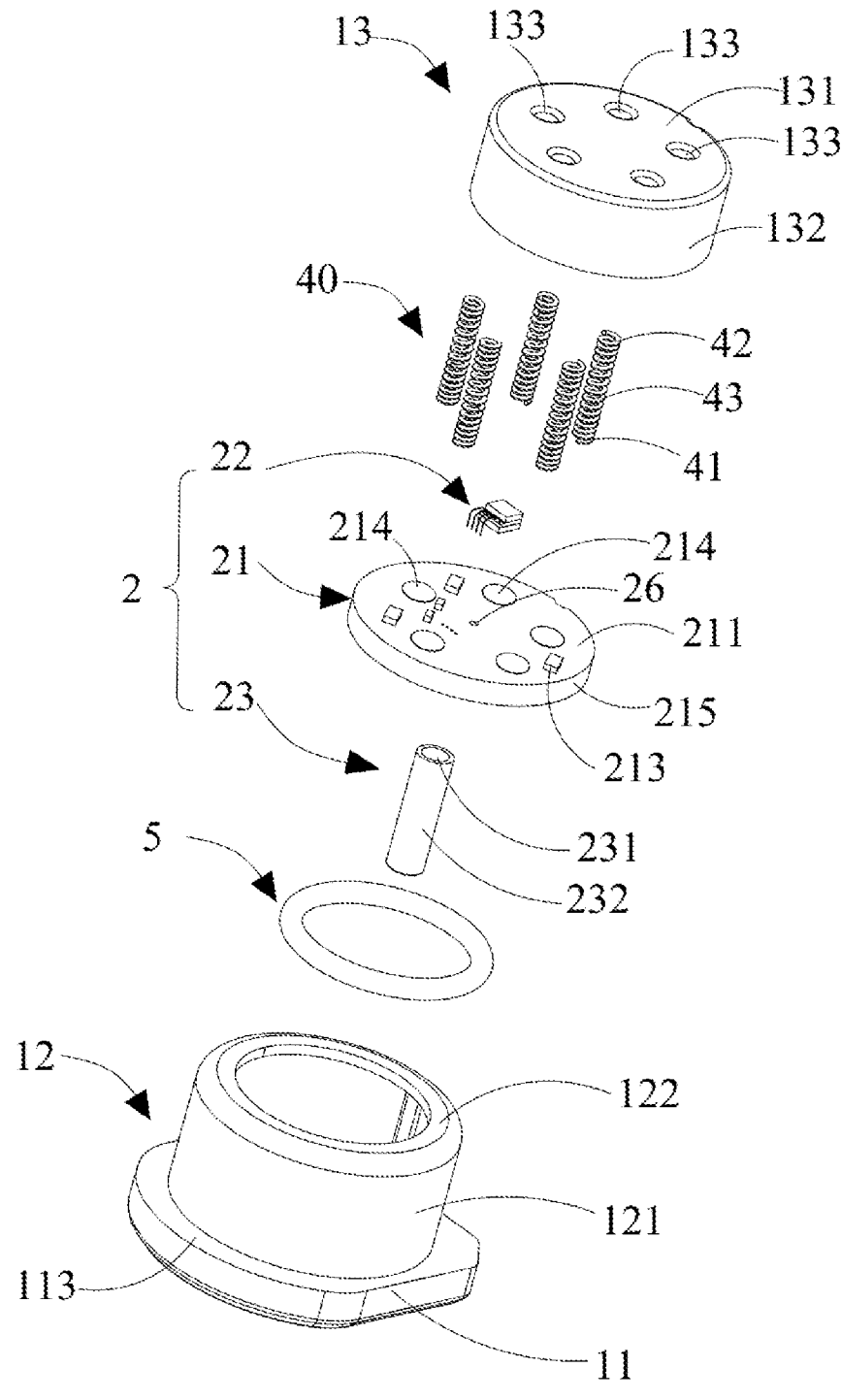
FIG. 3 is an exploded schematic view of the sensor device shown in FIG. 1.
Figure 4:
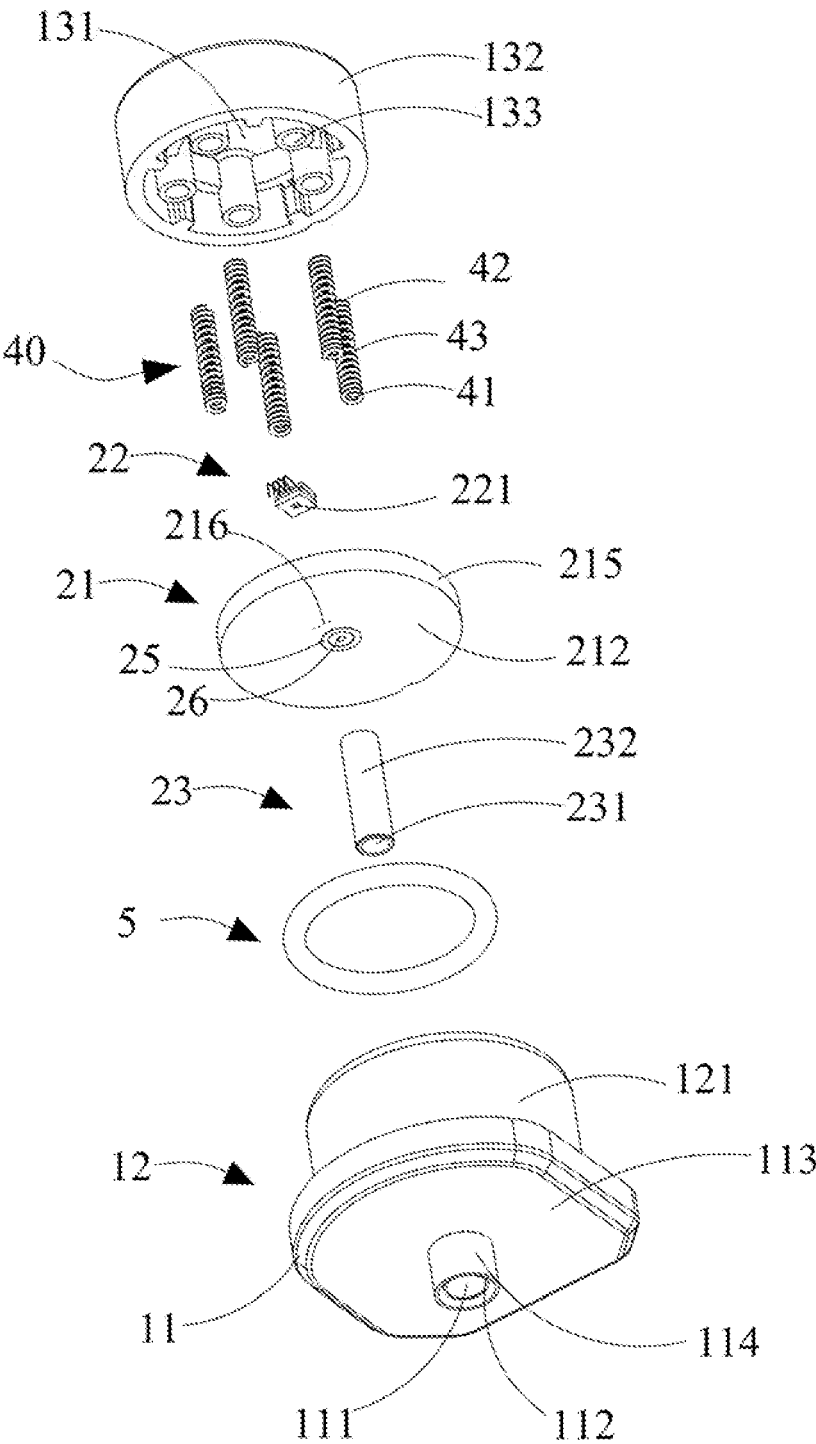
FIG. 4 is an exploded schematic view of the sensor device shown in FIG. 1 from another angle.

The second shell 13 may be provided with through holes 133. The sensor device 100 may include a plurality of conductive members 40. The conductive members 40 are at least partially accommodated in the through holes 133. As shown in FIG. 3 to FIG. 4, the conductive member 40 is a metal spring. The conductive member 40 includes a first end 41, a second end 42 and an intermediate portion 43 connected between the first end 41 and the second end 42. The first end 41 is in contact with the pad 214 formed on the first surface 211 of the circuit substrate 21. The intermediate portion 43 is accommodated in the through hole 133 of the second shell 13. The second end 42 extends upwardly from the intermediate portion 43 beyond the second shell 13. The first end 41 of the conductive member 40 is electrically connected to the circuit substrate 21. The second end 42 of the conductive member 40 is used for electrical connection with a component outside the sensor device 100. For example, the second end 42 abuts against a circuit board inside other valve component, that is, the signal sensed by the sensing element 22 can be conducted to the circuit board of the valve component, which facilitates further control of the valve component. The size of the through hole 133 on a side of the second shell 13 adjacent to the circuit substrate 21 is larger than the size of the hole on a side away from the circuit substrate 21. In some embodiments, in a direction away from the circuit substrate 21 along an axial direction of the through hole 133, the through hole 133 is a tapered hole with a gradually reduced diameter. The conductive member 40 is a conical spring adapted to the diameter of the through hole 133. That is, the conductive member 40 can be a conical spring with a small top and a large bottom, and the conductive member 40 can be in a compressed state after being connected to other circuit boards, which is beneficial to improve the stability of the connection between the conductive member 40 and an external circuit board. Of course, the second shell 13 can also be injection-molded by using the conductive member 40 as an injection-molding insert.

The first shell 12 can be made of metal material. The purpose of using metal material is to facilitate the processing of flanging so as to form the bent portion 122 and reduce the difficulty of forming. Meanwhile, the use of metal material also facilitates welding and fixing between the fitting portion 11 of the first shell 12 and the cylinder wall 232 of the sleeve 23. The first shell 11 is a metal part, which can also reduce the electromagnetic interference (EMI) from the outside to the electronic components inside the sensor device 100. The second shell 13 may be made of plastic material, which contributes to cost reduction and weight reduction of the sensor device 100. The second shell 13 is an insulating part, so that the first shell 12 and the conductive member can be insulated and isolated.

In some embodiments, the first shell 12 may be a metal part made of aluminum or a metal part made of stainless steel. The metal part made of aluminum is lighter in weight, so that when the sensor device 100 is used in an automotive thermal management system, it is beneficial to the light-weight design of the entire vehicle. The metal part made of stainless steel is slightly heavier than that made of aluminum, but the metal part made of stainless steel has the advantage of being convenient for welding. The first shell 12 made of metal can be manufactured by a process such as die casting, extrusion, or metal injection molding (MIM). The second shell 13 is an insulating part made of plastic material, and can be manufactured by an injection molding process. The second shell 12 made of insulating material insulates the conductive member 40 from the first shell 12.

The specific assembling and forming process among the second shell 13, the sensing assembly 2 and the first shell 12 is as follows: firstly, the bent portion 122 maintains the same vertical state as the outer cylindrical portion 121, and extends in a longitudinal direction. Then, the sensing assembly 2 is mounted into the inner space of the first shell 12. The extension portion 132 of the second shell 13 and an edge portion of the circuit substrate 21 are at least partially aligned in the longitudinal direction, and are assembled into the cylindrical space enclosed by the outer cylindrical portion 121 after being mated. At this time, the vertical bent portion 122 is pressed inwardly to form a transverse flange through a tooling. As a result, the extension portion 132 of the second shell 13 and the circuit substrate 21 are clamped and positioned between the bent portion 122 and the fitting portion 11, so that the second shell 13 can be stably installed relative to the first shell 12 without falling.

In some embodiments, as shown in FIG. 5, the fitting portion 11 includes a transverse wall 113 and a longitudinal wall 114. The transverse wall 113 extends from the outer cylindrical portion 121 in a direction perpendicular to the axial direction of the channel 231. The longitudinal wall 114 is located on a side of the transverse wall 113 away from the inner cavity 200, and the longitudinal wall 114 extends in the axial direction of the channel 231.

Referring to FIG. 5, the fitting portion 11 is provided with a groove 115. A notch of the groove 115 is disposed toward the circuit substrate 21. A groove wall of the groove 115 of the fitting portion 11 may be formed by protruding from the transverse wall 113 toward the second surface 212 of the circuit substrate 21. Of course, the groove wall of the fitting portion 11 forming the groove 115 may also be a part of the transverse wall 113, that is, the groove 115 is formed by concave from the transverse wall 113 toward the second surface 212 of the circuit substrate 21. In a manner shown in FIG. 5, the fitting portion 11 further includes a plurality of protruding structures protruding toward the circuit substrate 21 from the transverse wall 113 toward the second surface 212 of the circuit substrate 21. The second surface 212 of the circuit substrate 21 may be pressed against the above-mentioned protruding structures. The sensor device 100 also includes a buffer member 5. The buffer member 5 is at least partially received in the groove 115. One side of the buffer member 5 is in contact with the circuit substrate 21, and the other side of the buffer member 5 is in contact with a bottom of the groove 115. The buffer member 5 provided here can buffer the process of press-fitting the circuit substrate 21 to the fitting portion 11, thereby reducing the risk of damaging the circuit substrate 21 due to the hard contact between the second surface 212 of the circuit substrate 21 and an inner wall surface of the fitting portion 11 facing the second surface 212 of the circuit substrate 21. In the embodiment shown in FIG. 5, the buffer member 5 may adopt a sealing ring with certain elasticity. The sealing ring used as the buffer member 5 can also play the role of double sealing, which is more beneficial to improve the sealing performance of the sensor device 100.

Figure 10:
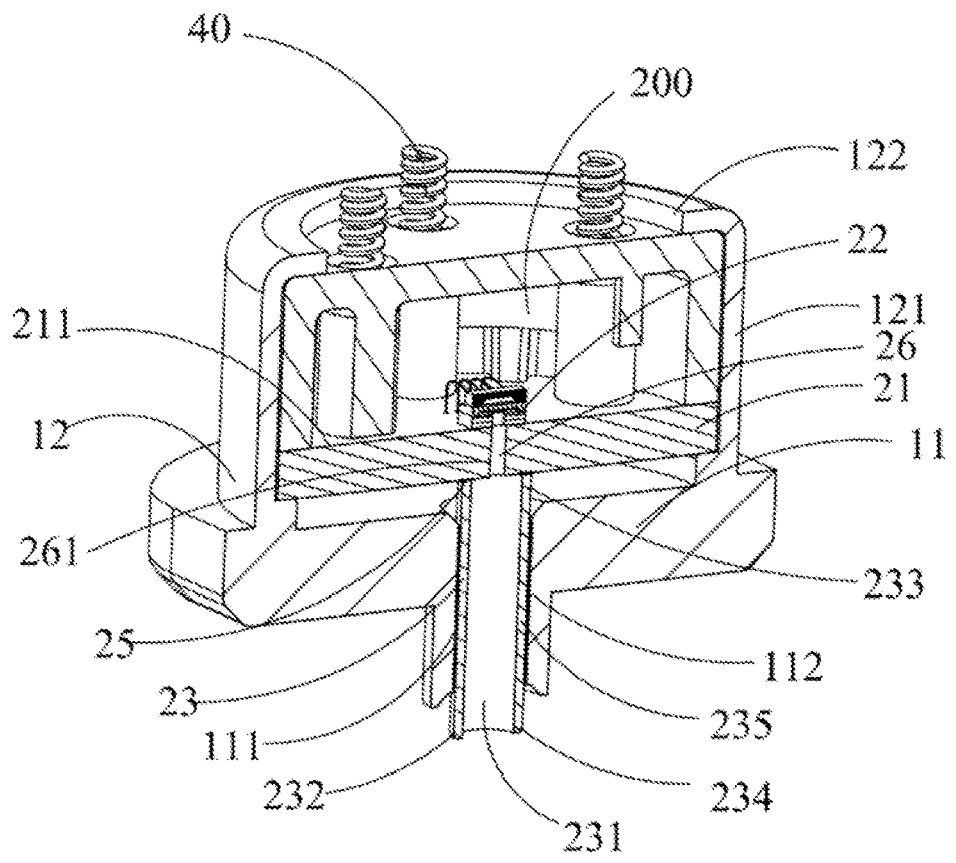
FIG. 10 is a schematic perspective cross-sectional view of the sensor device in a second embodiment of the present disclosure.

Of course, the sensor device 100 may not be provided with the buffer member 5. Referring to FIG. 10, some stepped structures may be provided at the transverse wall 113 to support the circuit substrate 21. Since the contact area between the circuit substrate 21 and the fitting portion 11 is small, the corresponding risk of crushing damage during the assembly process is also low. Other structures are basically the same as those shown in FIG. 5, which will not be described in detail in the present disclosure.

Figure 8:
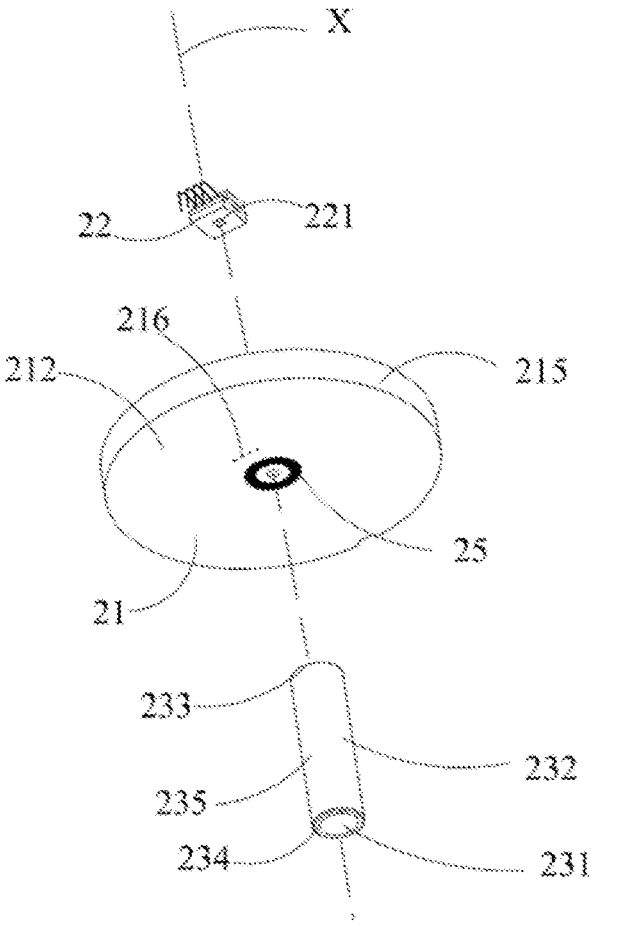
FIG. 8 is an exploded schematic view of the sensing assembly shown in FIG. 7.

As shown in FIG. 5 to FIG. 10, in some embodiments provided by the present disclosure, the sensing element 22 has a back-pressure chip structure. The sensing element 22 is at least partially located on a side of the circuit substrate 21 adjacent to the inner cavity 200, that is, the sensing element 22 may be located on a side where the first surface 211 is located. The circuit substrate 21 is provided with a perforation 26. The sensing element 22 has a sensing cavity 221. The sensing cavity 221 is not in communication with the inner cavity 200. The perforation 26 communicates with the sensing cavity 221 of the sensing element 22 and the channel 231. That is, one end of the perforation 26 communicates with the channel 231, and the sensing element 22 is located at the other end of the perforation 26. The sensing cavity 221 of the sensing element 22 communicates with the perforation 26. Referring to FIG. 8, the sensing cavity 221 of the sensing element 22, the perforation 26 of the circuit substrate 21 and the channel 231 of the sleeve 23 may be linearly distributed along an axis X. This is beneficial for shortening the flow path of the fluid and for miniaturizing the product.

Figure 9:
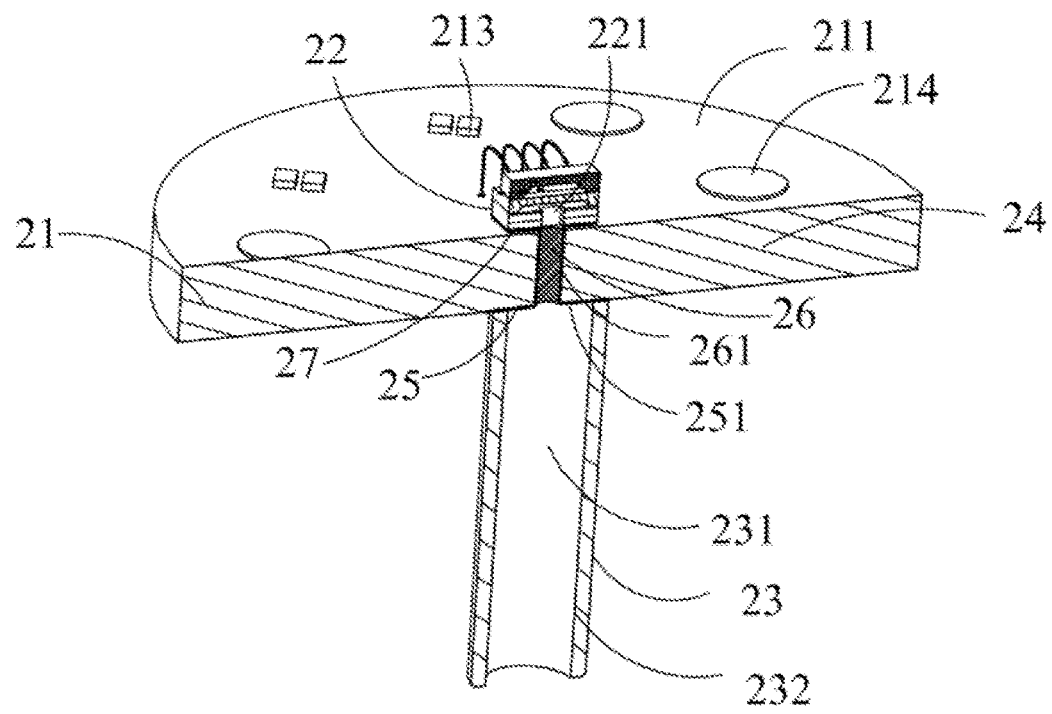
FIG. 9 is a schematic perspective cross-sectional view corresponding to another embodiment of the sensing assembly as shown in FIG. 1.

Referring to FIG. 9, the sensing element 22 and the circuit substrate 21 may be bonded and fixed by a sealant 27. That is, the bottom of the sensing element 22 and the substrate structure around the perforation 26 are sealed and bonded by the sealant 27. One side of the sensing cavity 221 is open and the other side is not open, so that the sensing cavity 221 is communicated with the perforation 26, but the sensing cavity 221 is not communicated with the inner cavity 200. Of course, the sensing element 22 may not be fixed to the circuit substrate 21 by the sealant 27. The sensing element 22 can be selectively soldered on the circuit substrate 21 by means of eutectic soldering. This soldering method enables the sensing element 22 to have better sealing performance against the perforation 26, and it is not easy for the fluid to enter the inner cavity 200 from the perforation 26.

In an embodiment of the present disclosure, the sensing element 22 is a back pressure type temperature and pressure chip. That is, the sensing element 22 is a back pressure type pressure and temperature sensor chip that integrates pressure and temperature sensing at the same time. A back pressure sensing element includes a structure such as a glass substrate and a silicon wafer. The fluid enters the sensing cavity 221 from a bottom hole of the sensing element 22. A front side of the back pressure sensing element 22 does not come into contact with the fluid. The surface of the sensing cavity 221 formed on the silicon wafer may be prepared by MEMS (Micro Electromechanical System) technology to form a pressure-sensing region and a temperature-sensing region. Chips made by MEMS technology are smaller in size. The corresponding product size is generally in the millimeter level, or even smaller. The sensing area can be pressure-sensed by a piezoresistive Wheatstone bridge. When it is connected to a circuit, when there is no pressure acting on a thin film of the silicon wafer, the Wheatstone bridge is balanced and the output voltage is zero. When pressure acts on the thin film of the silicon wafer, the balance of the Wheatstone bridge is broken, and there is a voltage output. Therefore, the change of the pressure can be reflected by the change of the electrical signal in a detection circuit, thereby realizing the function of pressure detection. The temperature sensing area can realize temperature detection through a PN junction diode circuit. Using the back pressure type temperature and pressure integrated sensing element 22 improves the degree of integration, which is beneficial to reduce the profile of the sensor device 100.

In order to better transfer fluid heat and reduce the influence of temperature difference on temperature detection, as shown in FIG. 9, the metal bonding portion 25 includes a heat conducting sub-portion 251. The heat conducting sub-portion 251 is located on a side of the ceramic base 24 adjacent to the sleeve 23, and the heat conducting sub-portion 251 is at least partially opposite to the channel 231. The heat conducting sub-portion 251 is also a metal structure covered on a surface of the ceramic base 24 by a copper cladding process. And/or, the circuit substrate 21 includes a second peripheral wall portion 261 forming the perforation 26. At least a partial region of the second peripheral wall portion 261 is made of metal. The perforation 26 may be similar to a circuit board hole or implemented by the circuit board hole, which adopts a copper immersion process so that the second peripheral wall portion 261 corresponding to the perforation 26 is also made of metal material.

In this way, when the fluid flows in the channel 231, compared with the sensing cavity 221 of the sensing element 22, the fluid is more likely to contact the heat conducting sub-portion 251 and the second peripheral wall portion 261. The heat conducting sub-portion 251 and the second peripheral wall portion 261 themselves are made of metal and have good thermal conductivity. Accordingly, it is easier to transmit the temperature of the fluid to the sensing element 22, so that the detection of the temperature signal is more accurate.

Figure 11:
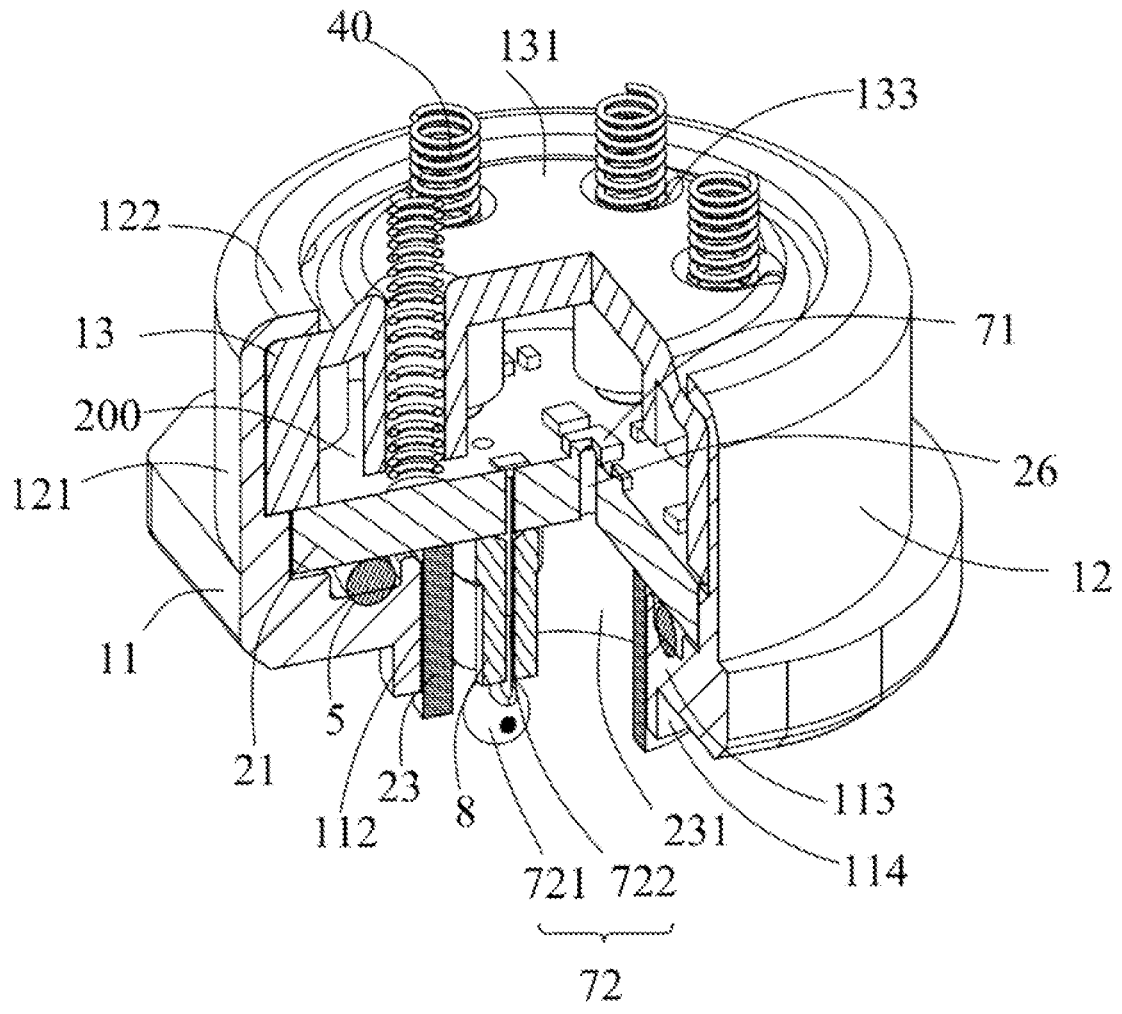
FIG. 11 is a schematic perspective cross-sectional view of the sensor device in a third embodiment of the present disclosure.

As shown in FIG. 11, in another embodiment of the present disclosure, the sensing assembly 2 includes two sensing elements 22. The two sensing elements 22 are a back pressure type pressure sensing element 71 and a pin type temperature sensing element 72, respectively. The structure of the back pressure type pressure sensing element 71 may be shown with reference to the back pressure type pressure sensing element 22 in FIG. 5. The temperature sensing element 72 includes a temperature sensing portion 721 and conductive pins 722. The temperature sensing portion 721 is located on a side of the circuit substrate 21 where the sleeve 23 is provided. That is, the temperature sensing portion 721 is closer to the channel 231 than the pressure sensing element 71. Accordingly, the temperature sensing portion 721 can be closer to the fluid to detect the temperature signal. The temperature sensing portion 721 may be located in the channel 231 or at least partially exposed outside the sleeve 23. The conductive pins 722 are located at least partially within channel 231. The conductive pins 722 are electrically connected to the temperature sensing portion 721 and the circuit substrate 21. In practice, the circuit substrate 21 may be provided with a plurality of holes 216. The conductive pins 722 may be located at least partially within the holes 216. Alternatively, the conductive pins 722 may extend to the first surface 211 of the circuit substrate 21 through the holes 216, and the conductive pins 722 are fixed at the holes 216 by soldering.

In some embodiments, the sensing assembly 2 further includes an insulating protective shell 8. The insulating protective shell 8 is at least partially located in the channel 231. The insulating protective shell 8 has a protective cavity 81 for accommodating at least part of the conductive pins 722.

Figure 12:
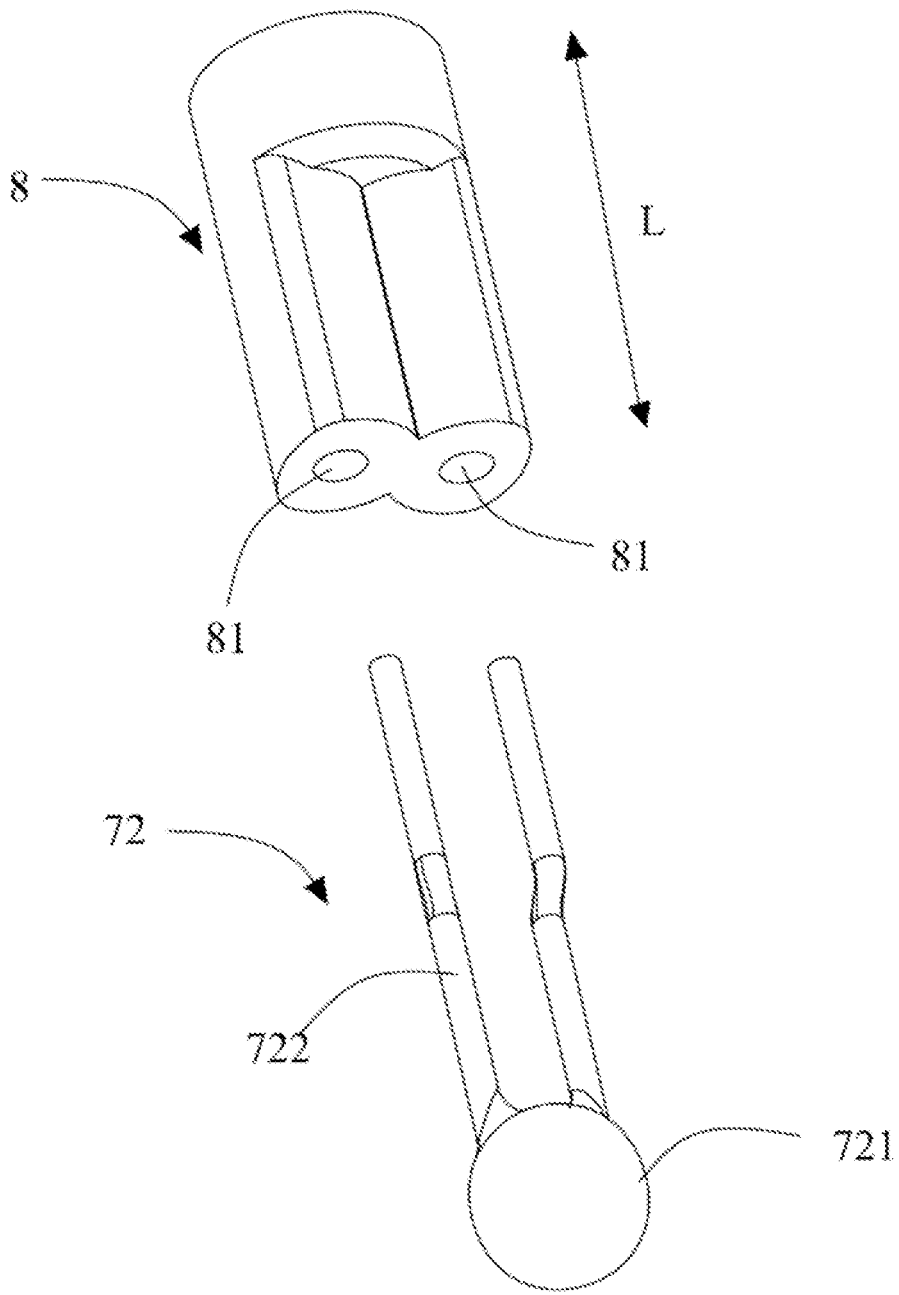
FIG. 12 is an exploded schematic view of some structural components of the sensor device shown in FIG. 11.

Alternatively, the insulating protective shell 8 is made of plastic material. As shown in FIG. 12, the insulating protective shell 8 includes two pin protection cavities 81 extending along a length direction (an L direction shown in FIG. 12) of the insulating protective shell 8. The conductive pins 722 are at least partially located in the protective cavities 81. For example, the conductive pins 722 of the temperature sensing element 72 extend through a lower end of the insulating protective shell 8, and protrude beyond an upper end of the insulating protective shell 8 and are soldered to the circuit substrate 21. In some embodiments, the upper end of the insulating protective shell 8 can be fixed on the second surface 212 of the circuit substrate 21 by means of physical structure fixing, gluing, soldering, etc., so as to enhance the stability of the insulating protective shell 8 when it is impacted by the refrigerant. The insulating protective shell 8 can also be directly sandwiched between the temperature sensing portion 721 and the circuit substrate 21, so that the structure is simpler and the production process is less. The lower end of the insulating protective shell 8 is adjacent to the temperature sensing portion 721, so as to protect the conductive pins 722 to the maximum extent. The design of the insulating protective shell 8 reduces the risk of the conductive pins 722 of the temperature sensing element 72 being impacted and corroded by the refrigerant, thereby improving the service life of the sensor device 100. The conductive pins 722 may also be coated with a refrigerant corrosion resistant coating, thereby further reducing the conductive pins 722 from being affected by the corrosion of the refrigerant. In FIG. 12, the upper end portion of the insulating protective shell 8 is in a shape of an integral cylinder, and the lower end portion is in a shape of two mutually coupled cylinders. Such a design can serve as a foolproof design to prevent the insulating protective shell 8 from being inserted in a wrong direction. Alternatively, one side of the insulating protective shell 8 is in contact with the circuit substrate 21, and the other side is in contact with the temperature sensing portion 721. The insulating protective shell 8 may be sandwiched between the circuit substrate 21 and the temperature sensing portion 721.

Figure 13:
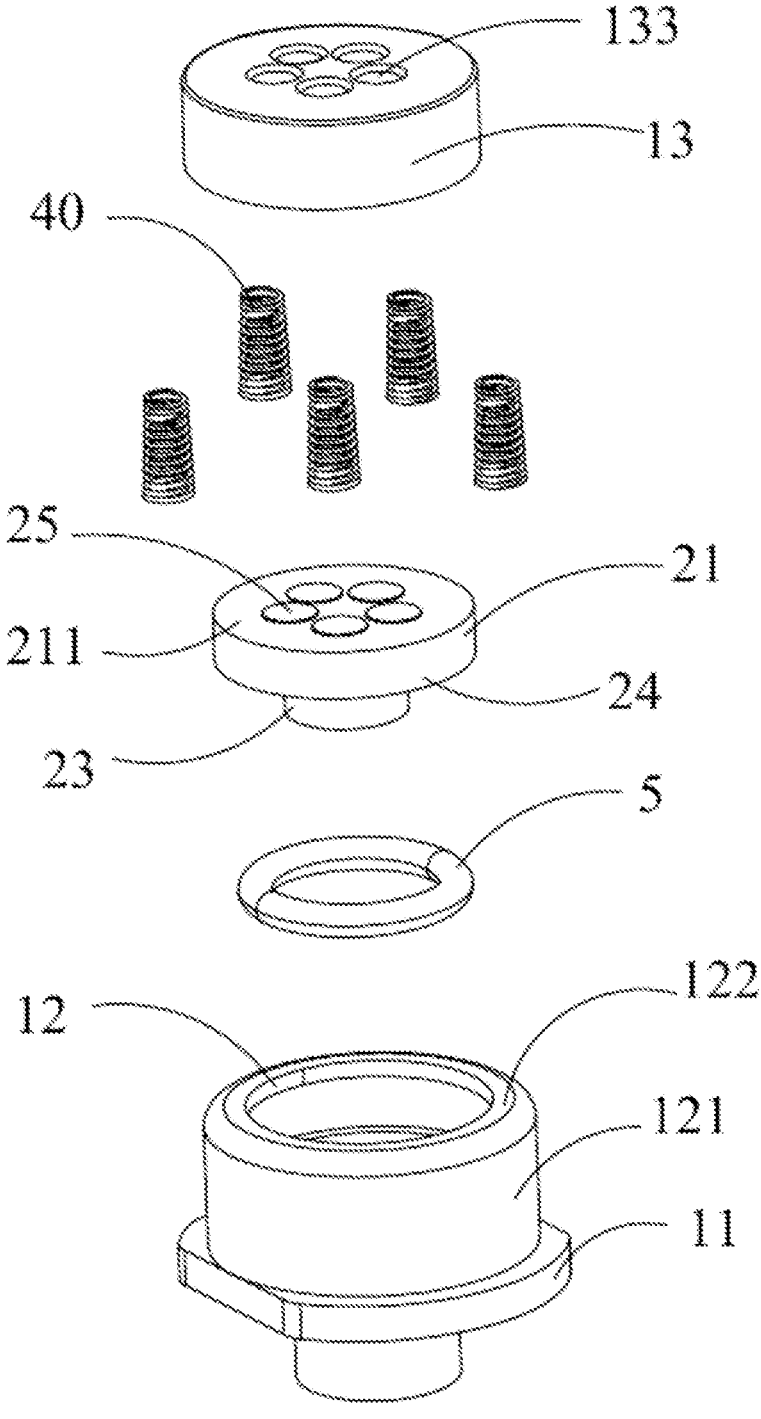
FIG. 13 is an exploded schematic view of the sensor device in a fourth embodiment of the present disclosure.
Figure 14:
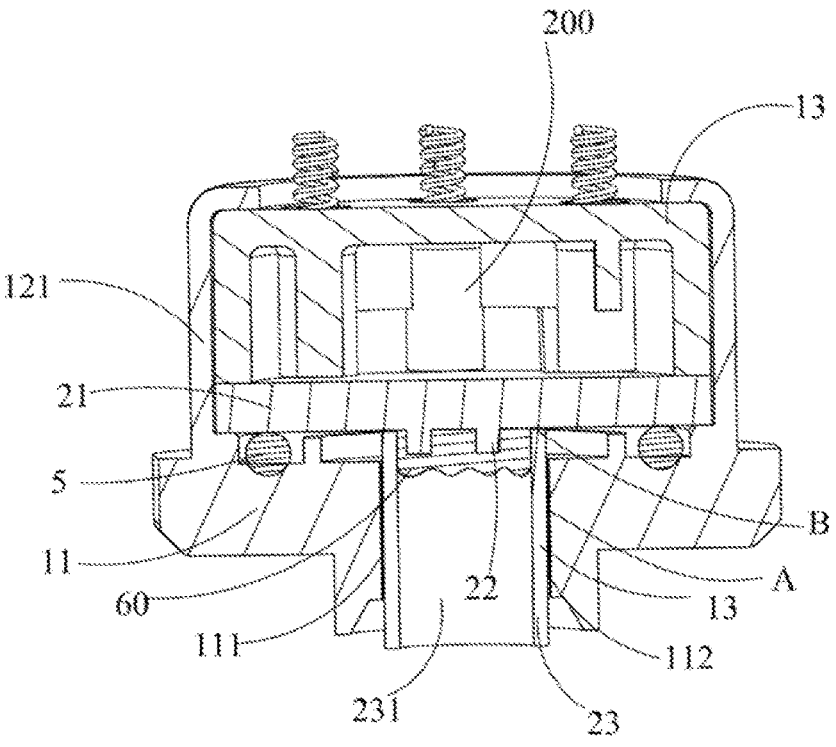
FIG. 14 is a schematic cross-sectional view of the sensor device shown in FIG. 13.
Figure 15:
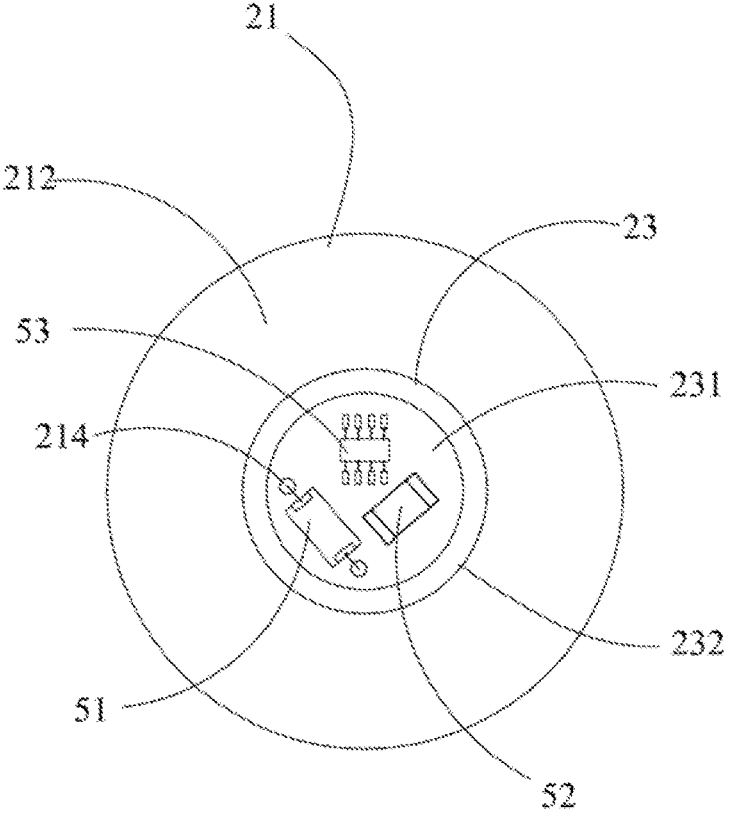
FIG. 15 is a schematic perspective structural view corresponding to an embodiment of the sensing assembly as shown in FIG. 13.

Referring to FIG. 13 to FIG. 15, in another embodiment of the present disclosure, the sensing element 22 is a positive pressure type temperature and pressure integrated chip, or the sensing element 22 is a positive pressure type pressure chip, or the sensing element 22 is a surface-mounted type NTC temperature element. The sensing element 22 is located at least partially in the channel 231. The cylinder wall 232 of the sleeve 23 is disposed around the sensing element 22.

The sensing assembly 2 further includes corrosion-resistant glue 60 filled in the channel 231. The corrosion-resistant glue 60 is adhered to an inner peripheral side of the cylinder wall 232. The corrosion-resistant glue 60 coats the sensing element 22 to avoid the sensing element 22 from directly contacting with the fluid.

In this embodiment, as shown in FIG. 15, the sensing assembly 2 includes two sensing elements 22, namely, a temperature sensing element 51 and a pressure sensing element 52. Both of the two sensing elements 22 adopt a positive pressure patch structure. The temperature sensing element 51 is a chip type NTC structure. The pressure sensing element 52 is a chip type positive pressure MEMS structure. The chip type NTC structure is a chip thermistor. A thermistor type temperature sensor decreases in resistance as the temperature increases. The size of the temperature sensing element corresponding to the chip thermistor is small, and some products are about 1.0 mm*0.5 mm in size. By wrapping the chip type temperature sensing element 51 and the chip type pressure sensing element 52 with the corrosion-resistant glue 60, it is beneficial to protect the temperature sensing element 51 and the pressure sensing element 52 from the corrosion, impact and so on of the refrigerant. Alternatively, the corrosion-resistant glue 104 may be fluorine-containing flexible silicone.

Referring to FIG. 15, in some embodiments, the sensing assembly 2 may further include a conditioning chip 53. The conditioning chip 53 is disposed on a side where the second surface 212 of the circuit substrate 21 is located, and is also wrapped and covered by the corrosion-resistant glue 60. The function of the conditioning chip 53 is to perform processing such as denoising, signal amplification, and signal compensation on the pressure signal or the temperature signal to improve the quality of the signal.

Figure 16:
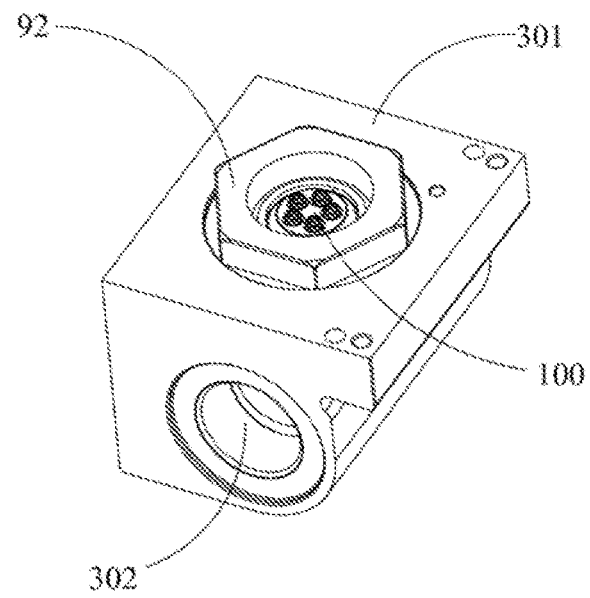
FIG. 16 is a schematic perspective structural view corresponding to an embodiment of a valve assembly of the present disclosure.
Figure 17:
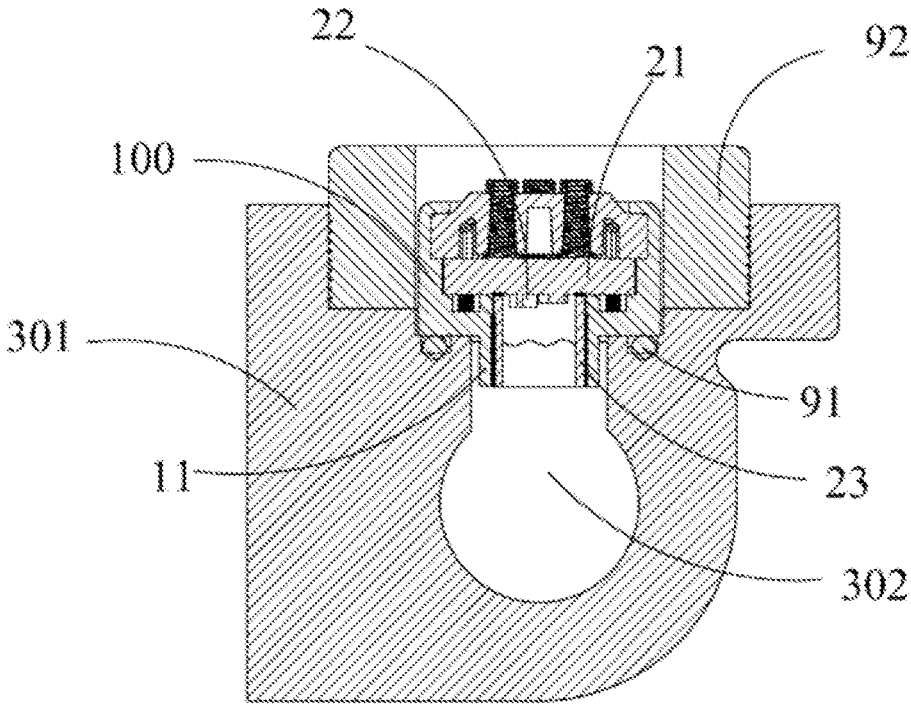
FIG. 17 is a schematic cross-sectional view of the valve assembly shown in FIG. 16.

Referring to FIG. 16 and FIG. 17, the embodiment of the present disclosure further provides a valve assembly 300 having the sensor device 100 in the above embodiments. The valve assembly 300 also includes a valve body portion 301. The sensor device 100 is fixedly attached to the valve body portion 301. The valve body portion 301 includes a first flow channel 302.

In a cross-sectional structure shown in FIG. 17, a sealing element 91 is further provided between the shell 1 of the sensor device 100 and the valve body portion 301. The valve body portion 301 is provided with an installation cavity. The sensor device 100 is at least partially accommodated in the installation cavity of the valve body portion 301. The sealing element 91 can be compressed between a wall of the valve body portion 301 forming the installation cavity and the transverse wall 113 of the shell 1. The shell 1 and the valve body portion 301 are sealed by the sealing element 91. In this way, the channel 231 forms a fluid-tight passage allowing the fluid to flow in its axial direction.

The valve assembly 300 also includes a pressing nut 92. For the sensor device 100, the transverse wall 113 of the first shell 12 thereof is radially outwardly convex with respect to the outer cylindrical portion 121. At least a portion of the protruding structure cooperates with the pressing nut 92. The pressing nut 92 is annular, and is provided on an outer peripheral side of the outer cylindrical portion 121. An outer circumference of the pressing nut 92 is screwed with the valve body portion 301 to fix the sensor device 100 and the valve body portion 301 together.

The valve assembly 300 provided in the embodiments of the present disclosure may also include a fluid control assembly. The fluid control assembly is fixed to the valve body portion 301. The fluid control assembly can be an electronic expansion valve which is used for refrigerant flow control in an automotive air conditioning system to realize throttling of the refrigerant. The fluid control assembly correspondingly includes structures such as a coil assembly, which will not be repeated in present disclosure. The sensor device 100 can be used as an integrated temperature and pressure sensor to detect the pressure and temperature of the refrigerant passing through the fluid control assembly. Of course, the fluid control assembly may also be other control valves or thermal management system components, etc., which can implement corresponding control of the refrigerant in the thermal management system assemblies.

The above embodiments are only used to illustrate the present disclosure rather than limit the technical solutions described in the present disclosure. The understanding of this specification should be based on those skilled in the art. For example, description directions, such as "front", "back", "left", "right", "top", "bottom", although this specification has described the present disclosure in detail with reference to the above-mentioned embodiments, those skilled in the art should understand that those skilled in the art can still make modifications or equivalent substitutions to the present disclosure, and all technical solutions and improvements which do not depart from the spirit and scope of the present disclosure should be covered within the scope of claims of the present disclosure.

What is claimed is:

1. A sensor device, comprising: a shell and a sensing assembly, the sensing assembly comprising a circuit substrate, a sensing element and a sleeve, the sensor device further comprising an inner cavity and a channel, the inner cavity and the channel being located on different sides in a thickness direction of the circuit substrate, respectively;

wherein the sleeve is located on one side in the thickness direction of the circuit substrate, the sleeve has a cylinder wall, one end of the cylinder wall along an axial direction of the channel is hermetically connected to the circuit substrate, the cylinder wall of the sleeve is located at an outer periphery of the channel, the sensing element is electrically connected to the circuit substrate, the sensing element is configured to sense pressure and/or temperature of a fluid in the channel; and the shell has a fitting portion, the fitting portion and the sleeve are located on a same side in the thickness direction of the circuit substrate, the fitting portion has an accommodating portion, the sleeve is at least partially accommodated in the accommodating portion, the fitting portion comprises a first peripheral wall portion forming the accommodating portion, the first peripheral wall portion is in sealing connection with an outer peripheral side of the cylinder wall of the sleeve, and the inner cavity is not in communication with the channel.

2. The sensor device according to claim 1, wherein an end of the cylinder wall along the axial direction of the channel is sealed and integrally fixed to the circuit substrate by soldering or laser welding, the first peripheral wall portion and the outer peripheral side of the cylinder wall are sealed and fixed integrally by one of soldering, laser welding, bonding, and ultrasonic welding.

3. The sensor device according to claim 2, wherein the shell comprises a first shell and a second shell, the first shell comprises an outer cylindrical portion, the fitting portion and a bent portion, a side of the outer cylindrical portion in the axial direction of the channel is connected to the fitting portion, another side of the outer cylindrical portion in the axial direction of the channel is connected to the bent portion, the outer cylindrical portion is disposed around the circuit substrate, the bent portion extends from the outer cylindrical portion toward a direction of an axis line of the outer cylindrical portion;

the second shell comprises a main body portion and an extension portion, the inner cavity is located between the main body portion and the circuit substrate, the extension portion is located on an outer periphery of the main body portion, the extension portion presses against the circuit substrate, and the bent portion presses against the extension portion.

4. The sensor device according to claim 3, wherein the fitting portion comprises a transverse wall and a longitudinal wall, the transverse wall extends from the outer cylindrical portion in a direction perpendicular to the axial direction of the channel, the longitudinal wall is located on a side of the transverse wall away from the inner cavity and extends along the axial direction of the channel;

wherein the fitting portion is provided with a groove, and a notch of the groove faces the circuit substrate; and the sensor device further comprises a buffer member, the buffer member is at least partially accommodated in the groove, one side of the buffer member is in contact with the circuit substrate, and another side of the buffer member is in contact with a groove bottom of the groove.

5. The sensor device according to claim 3, wherein the second shell is provided with a through hole, the sensor device comprises a conductive member, the conductive member comprises a first end, a second end and an intermediate portion connected between the first end and the second end, the first end is electrically connected to the circuit substrate, the intermediate portion is accommodated in the through hole of the second shell, and the second end extends upwardly from the intermediate portion beyond the second shell.

6. The sensor device according to claim 5, wherein the conductive member is a metal spring, an outer diameter of the first end is larger than an outer diameter of the second end, the circuit substrate comprises a pad, the first end abuts against the pad, and the second end is configured for electrical connection with external components.

7. The sensor device according to claim 2, wherein the sensing element is located in the channel, the cylinder wall of the sleeve is disposed around the sensing element; and the sensing assembly further comprises a corrosion-resistant glue filled in the channel, the corrosion-resistant glue adheres to an inner peripheral side of the cylinder wall, and the corrosion-resistant glue coats the sensing element so that the sensing element is not in direct contact with the fluid.

8. The sensor device according to claim 2, wherein the sensing element comprises a temperature sensing element, the temperature sensing element comprises a temperature sensing portion and conductive pins, the temperature sensing portion is located on a side of the circuit substrate adjacent to the sleeve, the conductive pins are at least partially located in the channel, and the conductive pins are electrically connected to the temperature sensing portion and the circuit substrate.

9. The sensor device according to claim 8, wherein the sensing assembly further comprises an insulating protective shell, the insulating protective shell is located in the channel, the insulating protective shell has a protective cavity which accommodates at least part of the conductive pins, one side of the insulating protective shell is in contact with the circuit substrate, another side of the insulating protective shell is in contact with the temperature sensing portion, and the insulating protective shell is sandwiched between the circuit substrate and the temperature sensing portion.

10. The sensor device according to claim 8, wherein the sensing element further comprises a back pressure-type pressure sensing element, and the temperature sensing portion is disposed closer to the channel than the pressure sensing element.

11. The sensor device according to claim 1, wherein the circuit substrate comprises a ceramic base and a metal bonding portion covered on a part of a surface area of the ceramic base by a copper cladding process, a material of the sleeve is metal, the cylinder wall and the metal bonding portion are sealed and connected by soldering, a material of the fitting portion is metal, the first peripheral wall portion and the outer peripheral side of the cylinder wall are sealed and fixed by means of laser welding.

12. The sensor device according to claim 11, wherein the sensing element is located on a side of the circuit substrate adjacent to the inner cavity, the circuit substrate is provided with a perforation, the sensing element has a sensing cavity which is not in communication with the inner cavity, the perforation communicates with the sensing cavity of the sensing element and the channel.

13. The sensor device according to claim 12, wherein the metal bonding portion comprises a heat conducting sub-portion, the heat conducting sub-portion is located on a side of the circuit substrate adjacent to the sleeve, and the heat conducting sub-portion is at least partially opposite to the channel;

and/or, the circuit substrate comprises a second peripheral wall portion forming the perforation, and at least part of the second peripheral wall portion is made of metal.

14. The sensor device according to claim 1, wherein the sensing element is at least one of a positive pressure type temperature and pressure integrated chip, a positive pressure type pressure chip, and surface-mounted type NTC temperature element, and the cylinder wall of the sleeve is disposed around the sensing element.

15. A valve assembly, comprising a valve body portion, the valve body portion being provided with a first flow channel, wherein the valve assembly further comprises a sensor device mounted to the valve body portion, the sensor device is the sensor device according to claim 1, and the channel is in fluid communication with the first flow channel.

16. The valve assembly according to claim 15, further comprising a pressing nut, wherein an outer circumference of the pressing nut is screwed with the valve body portion, and the pressing nut presses against the shell of the sensor device so that the sensor device is fixed to the valve body portion.

17. A sensor device, comprising:

a shell comprising a cavity and a fitting portion located at a side of the cavity, the fitting portion comprising an accommodating portion, and the accommodating portion being provided with an accommodating channel extending through the fitting portion; and a sensing assembly comprising a circuit substrate, a sensing element and a sleeve, the sensing element being electrically connected with the circuit substrate, an end of the sleeve being hermetically connected with the circuit substrate; the sleeve being provided with a fluid channel extending therethrough for leading a fluid to the sensing element, and the sensing element being configured for sensing at least one of a pressure and a temperature of the fluid;

wherein at least part of the sensing assembly is received in the cavity, the cavity comprises an inner cavity isolated from the fluid channel, the inner cavity and the fluid channel are disposed at two opposite sides of the circuit substrate along a height direction of the sensor device, respectively; at least part of the sleeve is disposed in the accommodating channel, and an outer peripheral side of the sleeve is in hermetically connection with the accommodating portion.

18. The sensor device according to claim 17, wherein the fitting portion is located at a side of the cavity along a height direction of the sensor device, and the accommodating portion extends along the height direction of the sensor device;

the sleeve comprises a cylinder wall located at a periphery of the fluid channel, an end of the cylinder wall along an axial direction of the fluid channel is sealed and integrally fixed to the circuit substrate by soldering or laser welding, and the height direction of the sensor device is parallel to the axial direction of the fluid channel;

the fitting portion comprises a first peripheral wall portion forming the accommodating portion, the first periphery wall portion is located at a periphery of the accommodating channel, the first peripheral wall portion and the outer peripheral side of the cylinder wall are sealed and fixed integrally by at least one of soldering, laser welding, bonding, and ultrasonic welding.

19. The sensor device according to claim 18, wherein the circuit substrate comprises a ceramic base and a metal bonding portion covered on a part of a surface area of the ceramic base by a copper cladding process, a material of the sleeve is metal, the cylinder wall and the metal bonding portion are sealed and connected by soldering, a material of the fitting portion is metal, the first peripheral wall portion and the outer peripheral side of the cylinder wall are sealed and fixed by laser welding.

20. The sensor device according to claim 17, wherein the shell comprises a first shell and a second shell, the first shell comprises an outer cylindrical portion, the fitting portion and a bent portion, a side of the outer cylindrical portion in the axial direction of the fluid channel is connected to the fitting portion, another side of the outer cylindrical portion in the axial direction of the fluid channel is connected to the bent portion, the outer cylindrical portion is disposed around the circuit substrate, the bent portion extends from the outer cylindrical portion toward a direction of an axis line of the outer cylindrical portion;

at least part of the second shell is located in the first shell, the second shell comprises a main body portion and an extension portion, the inner cavity is located between the main body portion and the circuit substrate, the extension portion is located on an outer periphery of the main body portion, the extension portion presses against the circuit substrate, and the bent portion presses against the extension portion.

\* \* \* \* \*